US008849644B2

(12) United States Patent
Tan et al.

(10) Patent No.: US 8,849,644 B2
(45) Date of Patent: Sep. 30, 2014

(54) PARALLEL SIMULATION USING AN ORDERED PRIORITY OF EVENT REGIONS

(75) Inventors: Chong Guan Tan, Los Altos Hills, CA (US); Chiahon Chien, Saratoga, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 406 days.

(21) Appl. No.: 11/962,005

(22) Filed: Dec. 20, 2007

(65) Prior Publication Data

US 2009/0164198 A1    Jun. 25, 2009

(51) Int. Cl.
 *G06F 17/50* (2006.01)
(52) U.S. Cl.
 CPC ................... *G06F 17/5022* (2013.01)
 USPC .............. 703/16; 703/13; 703/14; 703/17
(58) Field of Classification Search
 USPC ......................................... 703/13, 14, 16, 17
 See application file for complete search history.

(56) References Cited

U.S. PATENT DOCUMENTS

| 5,862,361 | A | * | 1/1999 | Jain ................................. 703/16 |
| 5,870,585 | A | * | 2/1999 | Stapleton ........................ 703/15 |
| 5,907,685 | A | * | 5/1999 | Douceur ....................... 709/248 |
| 6,117,181 | A | * | 9/2000 | Dearth et al. .................. 703/22 |
| 6,711,411 | B1 | * | 3/2004 | Ruffini .......................... 455/502 |
| 7,020,722 | B2 | | 3/2006 | Sivier et al. |
| 7,231,338 | B2 | | 6/2007 | Cavanagh et al. |
| 7,761,828 | B2 | * | 7/2010 | Miczo ............................... 716/7 |

OTHER PUBLICATIONS

"Direct Circuit Simulation Algorithms for Parallel Processing" Cox, Paul F. et al. IEEE Transactions on Computer-Aided Design, vol. 10, No. 6. Jun. 1991.*
"An improved cost function for static partitioning of parallel circuit simulations using a conservative synchronization protocol". Kapp, Kevin L. et al. Proceedings of the ninth workshop on Parallel and distributed simulation. pp. 78-85. 1995.*
"A Conservative Approach to SystemC Parallelization". Chopard, B. et al. Springer-Verlag Berlin Heidelberg 2006.*
Moorby et al., "Achieving Determinism in System Verilog 3.1 Scheduling Semantics," *DVCon 2003*, pp. 1-7.
Cummings et al., "System Verilog Event Regions, Race Avoidance & Guidelines," Rev 1.2, *Sunburst Design World Class Verilog & SystemVerilog Training, SNUG Boston 2006*, pp. 1-42.

* cited by examiner

*Primary Examiner* — Omar Fernandez Rivas
*Assistant Examiner* — Nithya J Moll
(74) *Attorney, Agent, or Firm* — Klarquist Sparkman, LLP (57) ABSTRACT

In one embodiment, a plurality of kernels are provided. Each kernel may simulate a partition of a design under test. A plurality of event regions are provided. The regions may be in an ordered priority. Events for the device under test may be determined for event regions in each of the kernels. An event region to execute events in is then determined and all kernels may execute events in the same event region. Kernels then execute events for the determined event region. When finished executing events in an event queue, data synchronization may occur. In this case, information may be synced among kernels, such as status and state values for shared objected are synchronized.

21 Claims, 7 Drawing Sheets

PARALLEL SIMULATION USING AN ORDERED PRIORITY OF EVENT REGIONS

BACKGROUND

Particular embodiments generally relate to parallel simulation of a design under test.

In the design of electronic devices, such as integrated circuits, a design is simulated to test whether it operates correctly. A model of the design may be described using a hardware description language (HDL), such as Verilog®.

To speed up simulation, a parallel simulation system may be used that simulates the design in parallel. Because the simulation is being performed in parallel, access to memory values shared by different simulations being performed in parallel is controlled. This is because one thread may access data memory values that may be wrong if access to the data memory is not controlled. Thus, when a thread accesses a data memory location, a semaphore may be used to lock the data memory location. Accordingly, other threads cannot access the data memory location. This slows down simulation as some threads may not be able to continue the simulation process while the data memory location is locked. Accordingly, the purpose of providing a faster simulation using multiple threads may be defeated because of the use of a semaphore to lock data memory locations may slow down the simulation.

SUMMARY

In one embodiment, a plurality of kernels are provided. Each kernel may simulate a partition of a design under test. For example, a design under test may be partitioned manually or automatically and each kernel may execute a partition.

A plurality of event regions are provided. The regions may be in an ordered priority. Events for the device under test may be populated for event regions in each of the kernels. An event region to execute events in is then determined and all kernels may execute events in the same event region. For example, the event region that is determined is one assigned the highest priority that have events to be executed. Kernels then execute events for the determined event region. For example, kernels execute events found in an event queue for the region. When finished executing events in the event region, data synchronization may occur. In this case, information may be synced among kernels, such as status and state values for shared objected are synchronized. Also, at this time, it is determined if any other events have been generated due to the execution of the prior events. For example, new events may be generated in a lower priority event region, in a higher priority event region, or in the event region that was just processed. If events have been generated in a higher priority event region, all kernels may move to that higher priority event region where the event queue for that region is then processed.

It is possible that not all kernels have events to execute in the determined event region. However, all kernels move to the same event region. The process continues as all kernels stay at the same event region and each event region may be processed in an ordered priority. When an event region of a higher priority has had all its events processed, then all kernels may move to a next lower priority event region to execute events in that event region. The above process allows processing of a design under test in parallel without using a semaphore. This is because all kernels process events at the same priority event region and data synchronization occurs at the end of processing events in the event region. Then, a determination as to which event region to move to next is performed. By adhering to this execution model, correct results may be calculated for the parallel simulation without locking access to shared objects.

A further understanding of the nature and the advantages of particular embodiments disclosed herein may be realized by reference of the remaining portions of the specification and the attached drawings.

DETAILED DESCRIPTION OF EMBODIMENTS

Figure 1:
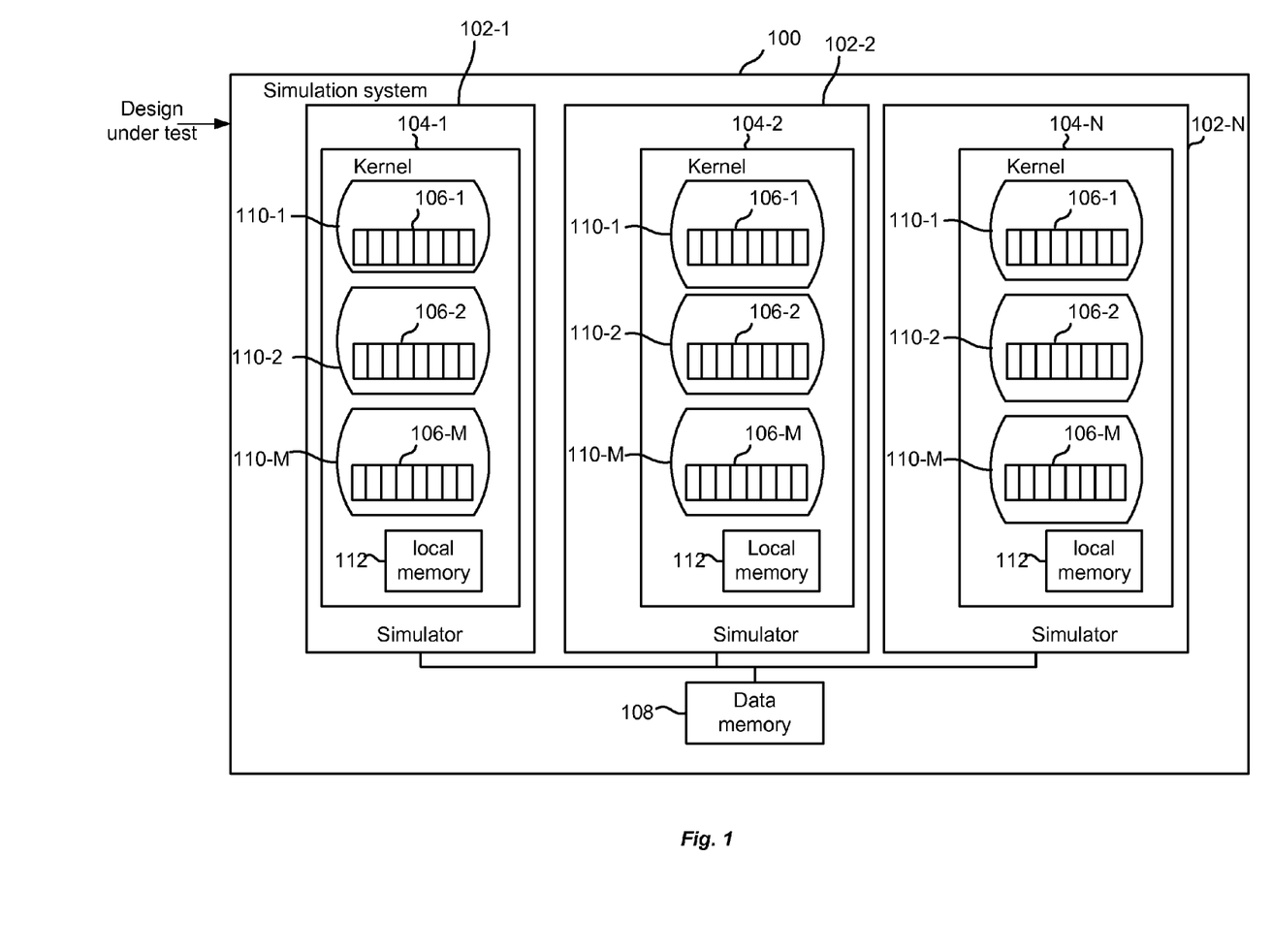
FIG. 1 depicts an example of a system for performing parallel simulation according to one embodiment.

FIG. 1 depicts an example of a system for performing parallel simulation according to one embodiment. As shown, a design under test is simulated. A plurality of simulators 102 may be used to simulate portions of the design under test.

Simulators 102 may be configured to perform simulation of a partition of the design under test. Simulators 102 may be hardware, software, or any combination thereof for simulating the design under test. For example, simulation programs known in the art may be used. Simulators 102 may be found on one or more computing systems. For example, simulator 102-1 and simulator 102-2 may be found on a first computing system, such as a workstation, personal computer, or other computing system, and simulator 102-3 may be found on a second computing system. It will be recognized that any number of simulators 102 may be used with any number of computing systems.

A plurality of kernels 104 perform the simulation. A kernel may include an execution engine that executes models of the design under test. Kernels 104 may run as separate threads or processes. For example, the system may be a multi-threaded parallel simulator that may be defined by a hardware design language (HDL) it supports. Each kernel 104 includes its own set of event queues where each kernel 104 may be executed by a thread or a separate process.

Each kernel 104 may include event regions 110 that are arranged in an ordered priority. The ordered priority may be defined based on an execution model that defines how types of events should be classified into different priority regions. For example, the language used to model the design under test, such as the hardware description language (HDL) may have a defined execution model. In one example, events that are determined for the simulation may be classified into different event regions 110 according to priority assigned to the events by the execution model. When event region is used, it will be understood that an event region is a term that is used to indicate different priorities are assigned to events.

One or more event queues 106 are provided to store events that need to be executed. In one embodiment, every event region 110 is associated with an event queue 106. For example, kernel 104 may have a plurality of event queues 106 where each event queue 106 is associated with a different priority. Thus, the term event region and event queue may be interchangeable. The concept of an ordered priority and where to store events may be implemented in different ways. For example, a single event queue 106 may be provided. In this case, events may be stored in the event queue and assigned different priorities (i.e., to a different event region). Also, any number of event queues 106 may be provided such that an ordered priority is assigned to events. Although particular embodiments are described as including an event queue 106 for each event region 110, it will be understood that variations may be appreciated.

Each kernel 104 processes events in event queues 106 in the same event region, i.e., events assigned the same priority. For example, all kernels 104 may be processing events in event queue 106-1 in a first event region. Even if kernels 104 do not have events in event queue 106-1, kernels 104 shall wait in that event region and do not execute events from another event region.

A data memory 108 is provided, which includes memory objects that may be shared among simulators 102. The memory objects may include data for variables that are used in simulation of the design under test. The objects may be shared by different kernels 104. That is, shared objects may be accessed by different kernels 104 during processing of events. If a variable AA is included in data memory 108, it may have a value of 12 at a first time. At some future time, kernel 104-1 may process a first event that uses AA. Kernel 104-2 may process a second event that also uses AA and may change the value of AA to 150. According to the HDL for the design under test, the value of AA should be 12 when the first event is executed. Thus, it is important that the second event that shares access to the shared object does not change the value of AA from 12 to 150 before the first event is executed.

Local memory 112 may also be provided. This includes objects that are local to kernels 104/simulators 102. These variables may also be shared among kernels 104. It will be recognized that different implementations of data memory 108 and local memory 112 may be provided as long as there are shared objects between kernels 104.

Data synchronization may occur at a data synchronization point. The data synchronization point may be when processing of the events in the event region is determined to be finished. For example, when processing of an event queue 106 starts execution, a defined number of events may be found in the event queue. An implicit last event may be designated as the data synchronization point. The last event may be the last event that is executed in event queue 106 (i.e., after execution, there are no more events left in event queue 106). Data synchronization occurs when a kernel 104 finishes processing implicit last event in event queue 106-1. If kernel 104-1 finishes processing events in event queue 106-1 before kernel 104-2, kernel 104-1 may synchronize data with other kernels 104. Also, kernel 104-1 may wait for kernel 104-2 to finish processing events in event queue 106-2. The synchronization may include exchanging information to indicate whether new events of higher priority have been generated, information on any new state values for memory objects that need to be sent from/to other kernels, information on if any kernel has been instructed to end the simulation, or information to indicate a highest priority queue in which new events have been generated. New events may be introduced into the event queues by state values for shared objects received during synchronization.

After data synchronization, kernels 104 then move to an event region 110 that should be processed next. For example, as events are executed in event queue 106, new events may be generated. These events may be generated in the same event region or other event regions. If events are generated in a higher priority event region, then all kernels 104 may jump to that higher priority event region and execute the events in that region. This is true even if kernels 104 do not have events to execute in the higher priority event region. If no events are found in a higher priority event region 110 after processing of events in event queue 106, processing may proceed to a lower priority event region 110. The process then continues to process all events for event regions 110. When all events in the event queues 106 have been processed for this time slot, the simulation time may then be moved forward.

In summary, particular embodiments provide a parallel simulation that processes events according to an ordered priority. The event regions as defined by the execution model may be used to determine priority but other priority schemes may be used. The design under test is partitioned and event queues 106 may be populated with events in different event regions. A highest priority event region may be determined and kernels 104 process events from event queue 106 in that event region 110. Data synchronization may occur when kernels 104 finish processing events in event queue 106. Kernels 104 then move to an event region 110 of a highest priority that includes events. By having kernels 104 move to the event region of highest priority, data correctness is maintained without locking or using a semaphore on shared objects. This is because events and data synchronization may be executed in an order that calculates the correct results if the execution of events in event regions 110 according to the ordered priority is followed.

Figure 2:
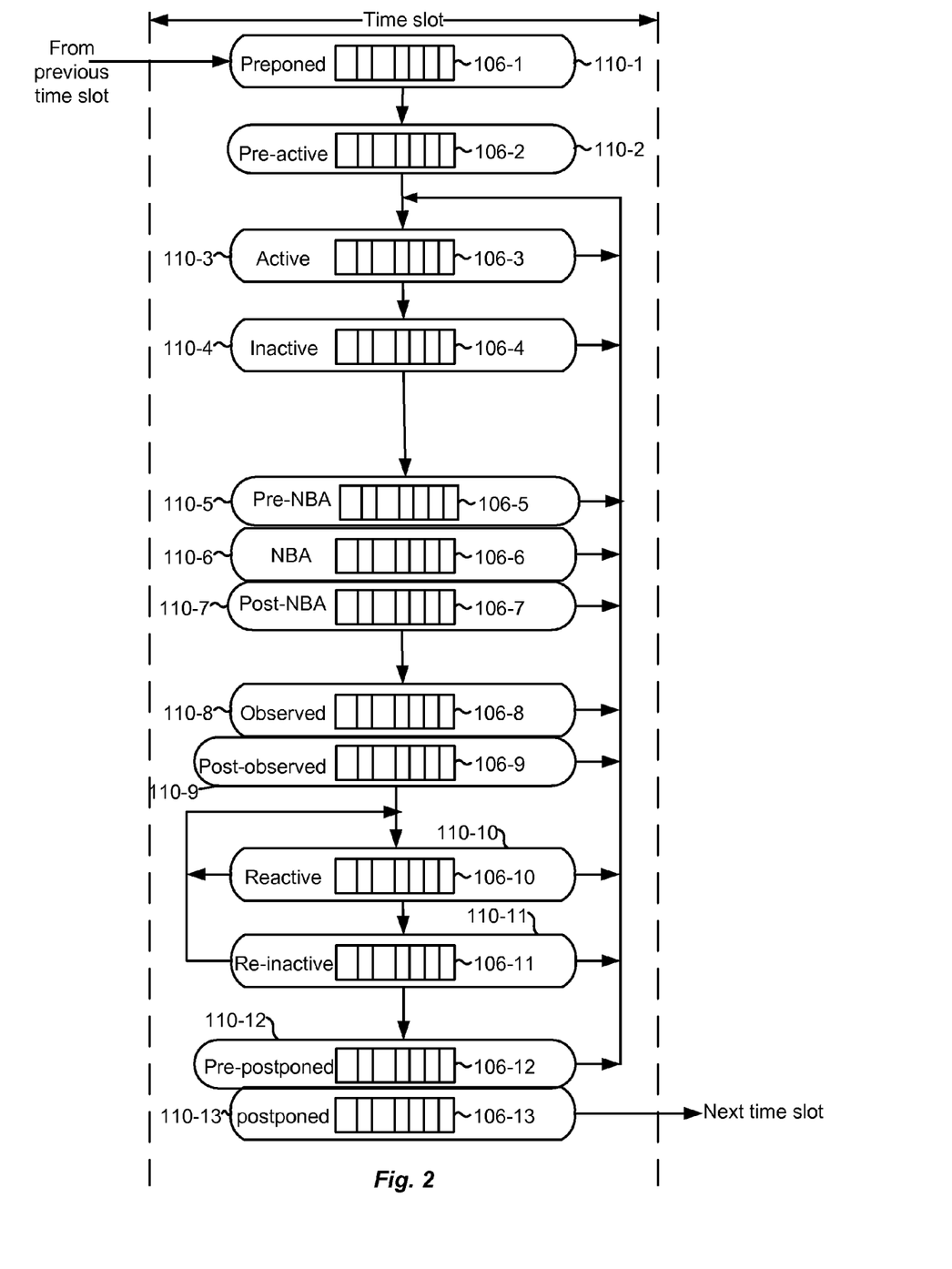
FIG. 2 depicts an example of event regions according to one embodiment.

FIG. 2 depicts an example of event regions 110 according to one embodiment. Event queues 106 may be arranged in net regions of different priorities. For example, event regions 110 may be assigned different priorities based on the execution model of a language used to model the design under test. For example, for SystemVerilog®, event regions may include:

A) Preponed
B) Preactive
C) Active
D) Inactive
E) Pre-NBA
F) NBA
G) Post-NBA
H) Observed
I) Post-Observed
J) Reactive
K) Re-inactive
L) Pre-postponed
M) Post-poned Although these regions are described, it will be understood that other regions may be appreciated. Also, different priorities may be used with different design languages. In one example, a time slot is divided into these sets of ordered regions. A time slot may be simulation time. For example, when all events have been processed in the event regions 110, the simulation may move to the next time slot.

An event queue 106 may be included in each event region 110. Although the one to one relationship is shown, it will be understood that any number of event queues 106 may be provided. The priority may be assigned to each event region 110 as described above. In one embodiment, kernels 104 execute events in event queues 106 at a determined priority. For example, the highest possible priority for an event region 110 that includes events to be executed is selected. For example, if events are found in event queues 106 in event region 110-3 and 110-4, events in event region 110-3 are executed before events in event region 110-4. Also, as described above, all kernels 104 process events from event queues 106 in the same event region 110.

The following flowchart allows processing of events to reiterate to previous higher priority event regions 110. For example, if after processing events in event region 110-4, new events may be created in event region 110-3, the process then reiterates to event region 110-3 to process the newly-created events.

Figure 3:
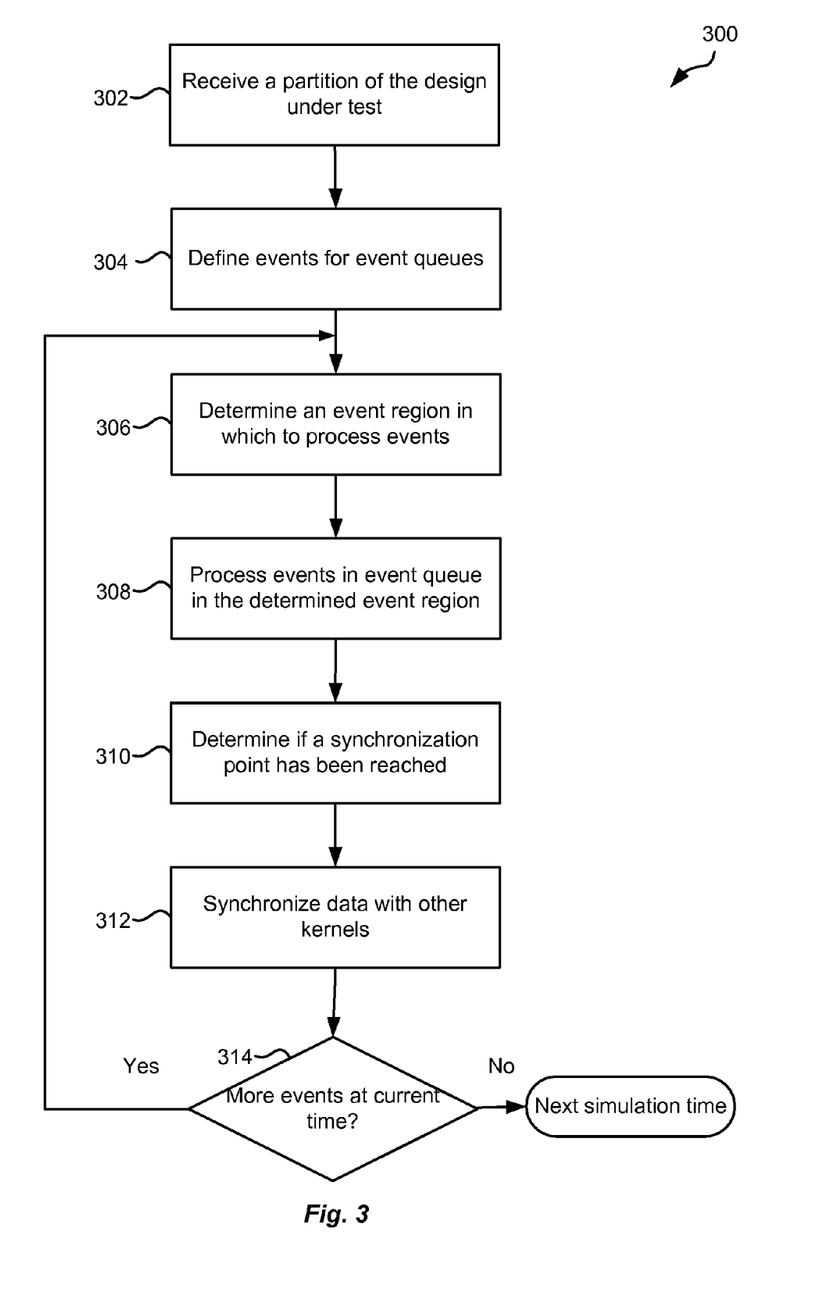
FIG. 3 depicts a simplified flowchart of a method for performing a parallel simulation according to one embodiment.

The following now describes the processing of events for a time slot. FIG. 3 depicts a simplified flowchart of a method for performing a parallel simulation according to one embodiment. The method may be performed by each kernel 104 separately. In step 302, kernel 104 receives a partition of the design under test. In one embodiment, the partition may be performed automatically or manually. For example, the design under test may be automatically analyzed and partitioned. Also, a user may manually partition the design under test. The partitions may be assigned to different kernels 104.

In step 304, kernel 104 defines events for event queues 106. For example, events that need to be processed for a time slot may be determined and are populated in event queues 106. The events that need to be processed for a time slot may include events for different event queues 106 in different event regions 110.

In step 306, kernel 104 determines an event region 110 in which to process events. In one embodiment, all kernels 104 operate in the same event region 110 at a given delta time. The event region 110 determined may be based on the priority discussed in FIG. 2. For example, the highest priority event region 110 is determined. Although the highest priority event region 110 may be determined, there may be situations where the highest priority event region 110 is not chosen. A higher priority event region 110 may not be chosen if it is manually or mechanically determined to have no material effect on the results of the simulation.

In step 308, kernel 104 processes events in event queue 106 in the determined event region 110. The events may be processed in any order. Kernel 104 processes the events until a synchronization point is reached. The synchronization point is a point in which information should be exchanged between kernels 104. For example, the synchronization point may be when processing of events in event queue 106 is determined to be finished. When the end of event queue 106 is discussed, it will be recognized that the end may be when all events in event queue 106 have been processed that should have been processed in the delta time. Events can be processed in any order. Thus, the end of the event queue may be the head, tail, or somewhere in the middle of the queue.

Some examples of data synchronization points include the end of a current active event queue, end of non-active event queue, the end of non-blocking active (NBA) event queue, end of re-active event queue, and the end of time. If the end of the current active event queue is used, it is when all active events as defined at the beginning of the delta time have been executed and their effect has either been scheduled into a future time or into a different event queue.

Step 310 determines if a synchronization point has been reached. If not, kernel 104 continues to process events in event queue 106. If a synchronization point is reached, in step 312, kernel 104 synchronizes data with other kernels 104. When kernel 104 arrives at a data synchronization point, kernel 104 may synchronize data with other kernels 104. Also, kernel 104 may wait for other kernels 104 to finish executing their event queue 106 for all kernels 104 to perform data synchronization at the same time. Kernels 104 do not move to another event region 110 to process events while another kernel 104 is processing events from a different event region 110. That is, kernels 104 stay in the same event region 110. This may ensure that all kernels 104 of a parallel simulator are at the same data synchronization point when the data exchange is performed. Also, all kernels 104 are at the same simulation delta cycle in the same simulation time. This may guarantee that the parallel simulator conforms to the semantic requirements of the execution model of the hardware design language. Also, this ensures that the parallel simulator delta cycle is accurate per the execution model that it supports.

The data synchronization may exchange data between kernels 104. This exchanges data between partitions of the design under test. Thus, data that may be needed by other partitions of the design under test for the simulation may be exchanged. For example, the changes in shared object states are sent from a kernel to other kernels that need to use them before the end of the delta cycle that causes the state changes. The data received in the other kernel may be received in the same delta cycle. All events caused by the new data from other kernels 104 may be scheduled in the next delta cycle may be in other event queues 106. Thus, the data synchronization point also allows new events that are generated to be introduced.

In step 314, kernel 104 determines if more events are found in any event queues 106 for the current time slot. If no more events are found in event queues 106, then the simulation time may be moved forward as described in step 318, which will be described in more detail below.

If there are more events to process for the time slot, the process reiterates to step 306 to determine an event region 110 in which to process the events. In one example, all kernels 104 may move to the same event region 110. A status signal may be sent by kernels 104 to allow the next event region 110 to be determined. For example, the status may include a determination if any new event of a higher priority than the current event region 110 in which the events were processed has been marked for execution. Also, information on whether a kernel 104 has received or sent new state values for shared objects to other kernels or whether any kernel has been instructed to end the simulation may be used to determine the event region 110. A globally aggregated status for the above information may be aggregated and communicated to all the kernels. For example, a master kernel 104 can be designated that aggregates the status. Then, a signal indicating a determined status (e.g., the event region to move to) is sent to slave kernels 104. Also, each kernel 104 may locally compute the status based on information received from other kernels 104.

If events have not been introduced in event region 110 of higher priority than or same as the current event region 110, then kernel 104 may move to the next event region 110 of lower priority. For example, referring to FIG. 2, if event region 110-2 was just processed, events in the event region 110-3 may now be processed. The process then continues as kernels 104 move through event regions 110 until all events in event regions 110 have been processed.

When events have been executed in the time slot, kernels 104 are marked to perform a time sync move simulation time forward step. This is a time synchronization that moves the simulation time forward. In one embodiment, each kernel 104 may contribute the smallest delta time to the next non-empty event queue 106 in its kernel 104 or a special status indicating it has no further events. The minimum of these delta times may be the next simulation time delta when kernels 104 should perform data synchronization again. The next simulation time delta may be broadcast to all kernels 104 or computed locally by each kernel 104. All kernels then move the next simulation time delta forward.

Upon moving the simulation time forward, each kernel 104 may mark the synchronization point with the highest priority for the data exchange. If synchronization points are not available for marking due to the HDL definition and/or implementation considerations, a higher priority process performing the marking may be inserted into an event queue 106 that has higher priority than the synchronization points. This point may then be used as a synchronization point.

The data synchronization points may also be selectable. For example, a user with knowledge of the design under test may decide that some synchronization points do not have material impact on the simulation results, and choose to disable them. In one example, a design under test may not use the NBA event region 110 and thus does not require the NBA event region 110 as a synchronization point and synchronization at this point may be disabled.

In one embodiment, a user may specify one or more events to trigger the synchronization. When user controlled synchronization events are encountered, the synchronization process starts from the highest selected or possible event region 110, and proceeds as the normal synchronization described earlier. When all events in the current time step have been executed, the synchronization becomes dormant and awaits the next occurrence of user specified control of a data synchronization point. Also, it will be recognized that user controlled data synchronization points may be synchronized in combination or in lieu of data synchronization points determined based on the execution model.

Figure 4:
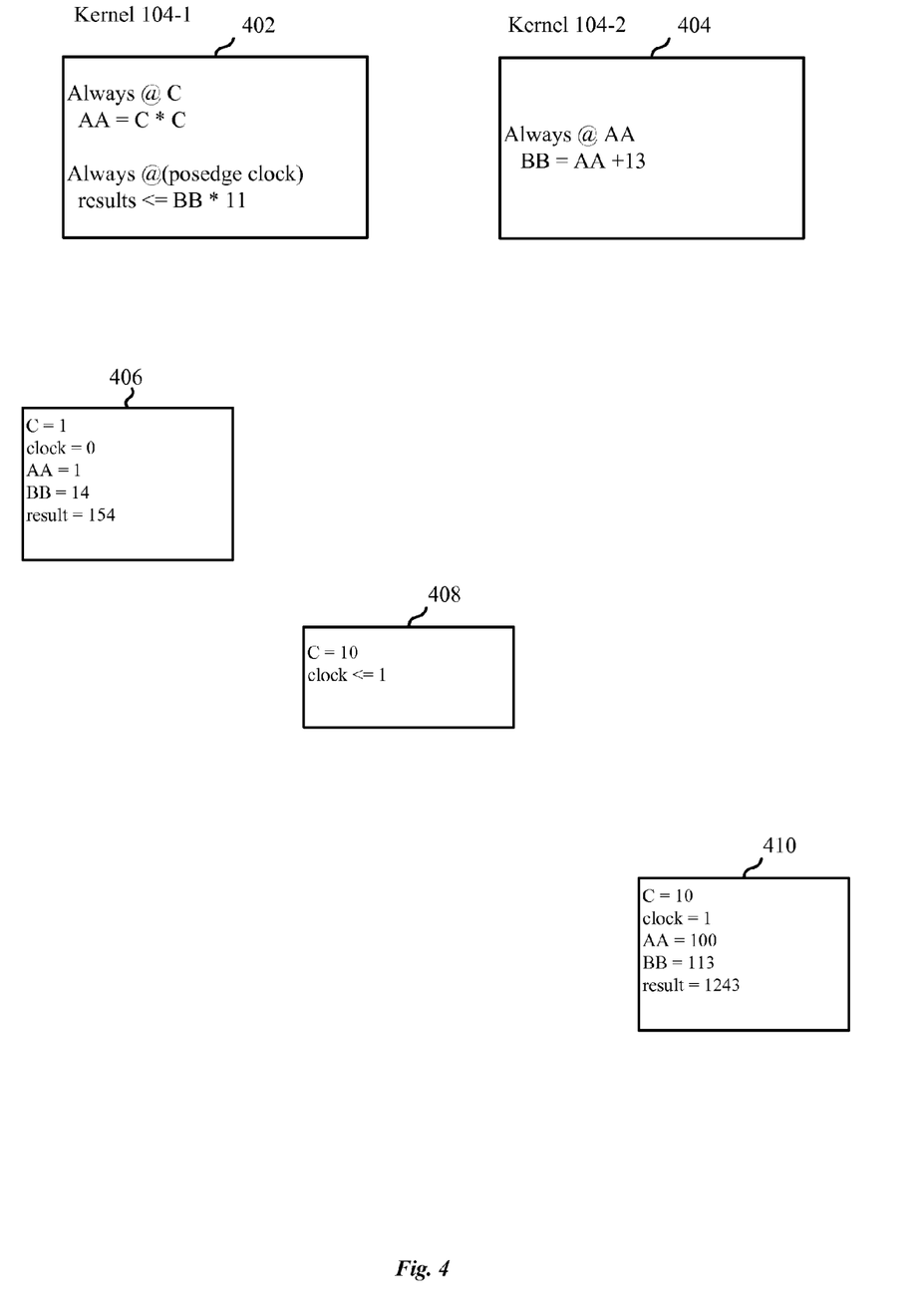
FIG. 4 depicts an example according to one embodiment.

FIG. 4 depicts an example according to one embodiment. As shown in boxes 402 and 404, kernels 104-1 and 104-2 include instructions for the design under test. At the end of simulation time 99, state values for objects in memory 108 are shown in box 406. At time 100, the following changes are applied, which are processed in kernel 104-1 and shown in a box 408. In this case, C=10 and clock <=1. Assuming these changes, the results of state values at the end of simulation time 100 are shown in a box 410. In this case, AA=100, BB=113, and results=1243. These are the results that may occur when simulating on a single kernel simulator.

In the instructions shown in FIG. 4, two event regions 110 are involved, the active event region and NBA event region. The event regions 110 are assigned different priorities, i.e., the active event region may be assigned a higher priority than the NBA event region. The instructions also state that if the state of "C" is changed, then an event is generated that executes the instruction "AA+13". If the rising edge of a clock is detected, then an NBA event that executes the instruction "results <=BB*11" is also generated.

Figure 5A:
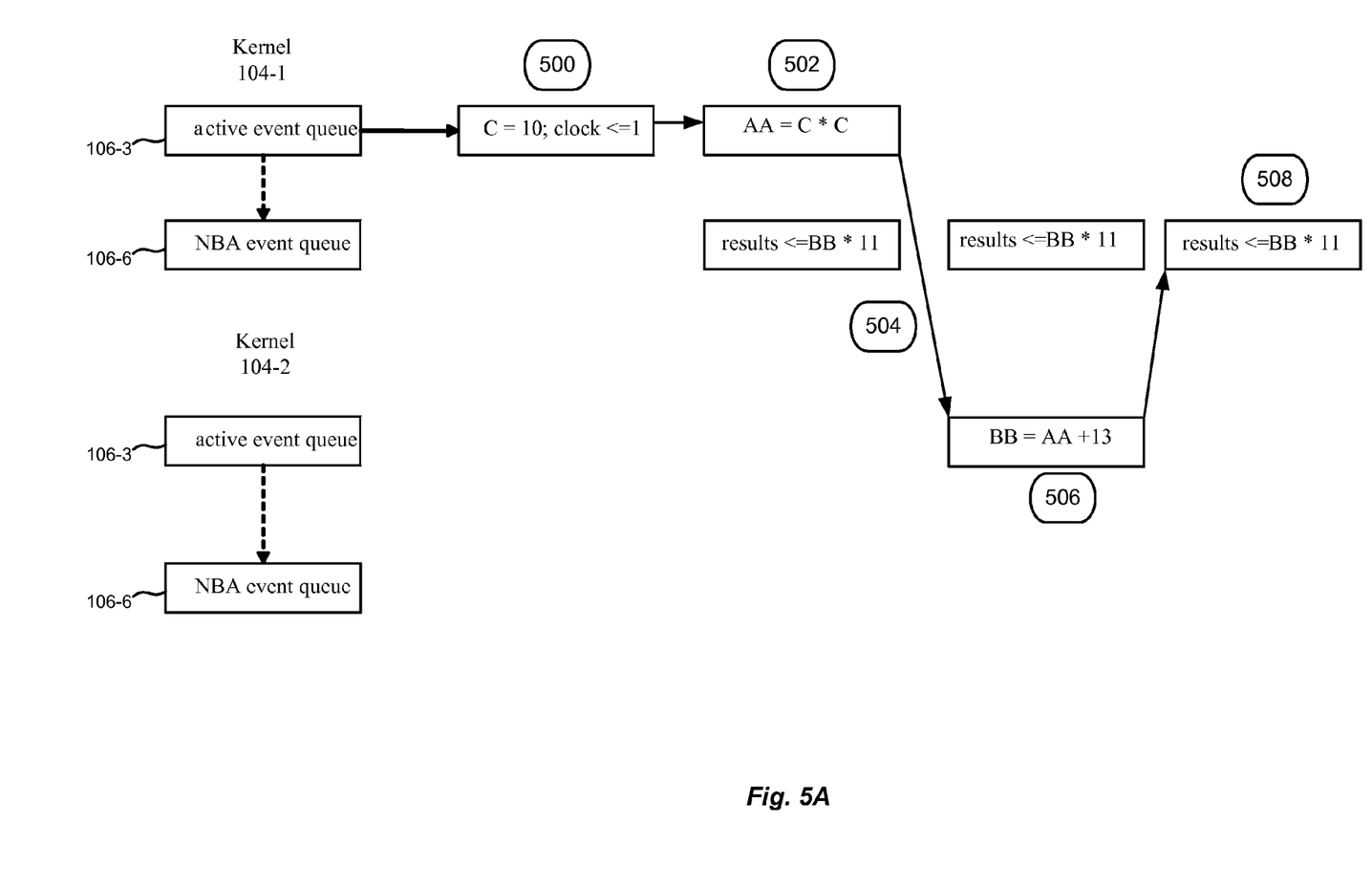
FIGS. 5A and 5B show an example of processing of events using particular embodiments.
Figure 5B:
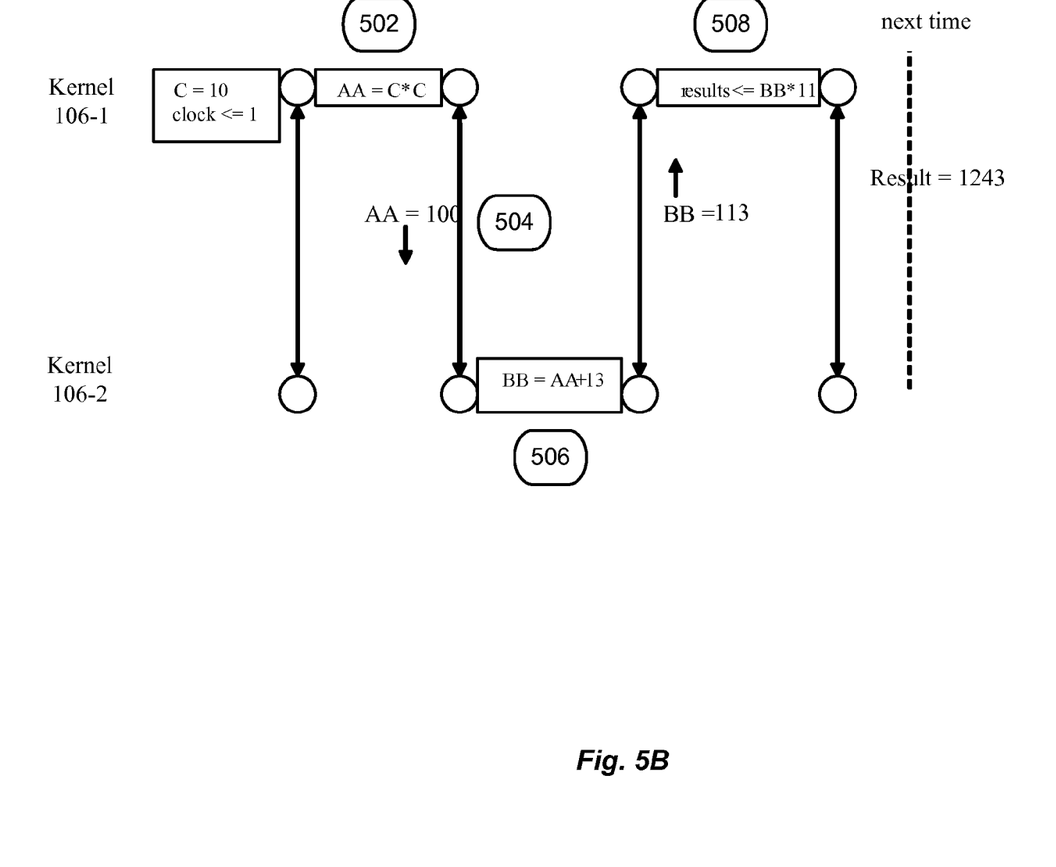

FIGS. 5A and 5B show an example of processing of events using particular embodiments. In FIG. 5A, the active event queue 106-3 in active event region 110-3 and NBA event queue 106-6 in NBA event region 110-6 are shown for kernels 104-1 and 104-2. FIG. 5B shows a flow diagram from a time standpoint.

The flow starts at time=100. At 500, the changes to C=10 and clock <=1 are applied. Kernel 104-1 then executes the event AA=C*C. This causes AA to be equal to 100. As shown at 502 in FIG. 5A, the event AA=C*C is found in active event queue 106-3 of kernel 104-1. Also, when the rising edge of the clock is detected, the event results=BB*11 is included in NBA event queue 106-6 for kernel 104-1. However, kernel 104-1 is processing events from active event queue 106-3 and does not process the event in NBA event queue 106-6. Kernel 104-2 is also processing events in active event queue 106-3. However, at this time, no events are found in active event queue 106-3 for kernel 104-2. Kernel 104-2 thus waits for the synchronization point and does not process events from NBA event queue 106-6.

Upon kernel 104-1 reaching the end of active event queue 106-3, data synchronization is performed as shown at 504 in FIG. 5B. The data synchronizations are shown as circles in FIG. 5B. As discussed above, if the state of "C" is changed, then event of BB=AA+13 is generated. In this case, a new event is added in active event queue 106-3 for kernel 104-2. This is shown at 506 in FIGS. 5A and 5B. At this point, kernel 104-2 includes the new event in active event queue 106-3 and kernel 104-1 does not include any events in active event queue 106-3. Also, the event results BB*11 is found in NBA event queue 106-6, but this event is not processed because kernel 104-1 stays in the same priority for an event region as kernel 104-2. In this case, BB=AA+13 is processed and the value of BB=113 is determined.

Kernel 104-2 reaches the end of active event queue 106-3 and a data synchronization is triggered. As shown in FIG. 5B, the value of BB=113 may be synchronized with kernel 104-1.

There are no events left in active event queue 106-3 for kernel 104-1 and kernel 104-2. Also, events in any higher priority event regions 110 have not been generated. Thus, an event region 110 of a lower priority may be determined. In this case, NBA event queue 106-6 may be processed as being the next lowest priority event region 110 that includes events. The event "results <=BB*11" is then processed. The value of BB=113 is used to determine "results", and "results=1243" is determined. This is the correct result and the result that would have been determined if a single simulator was used.

It should be noted that the events "AA=C*C" and "results <=BB*11" were included in active event queue 106-3 and NBA event queue 106-6 for kernel 104-1 at 502. If kernel 104-1 executed these local events at 502, then the wrong result may have been determined. If these local events are performed by kernel 104-1, since C=10 and BB=14 at the time that these local event are evaluated, the values of AA=100 and results=154 are determined, and then data synchronization may occur. The new event BB=AA+13 is generated for kernel 104-2. In this case, BB=113. Data synchronization may occur and the value BB is calculated as 113. However, because the event "results <=BB*11" has already been performed, there is no new events to perform. Thus, the result of 154 is determined, which is the wrong result because the value of BB=113 was not used. Thus, by adhering to executing events according to the priority of event regions 110, the correct result may be determined. The correct result is determined without locking access to shared objects. In the above example described in FIGS. 5A and 5B, a lock on the shared object of BB is not used. However, because data synchronization occurs at the end of event queues for event regions 110 and kernels 104 process events in the same event region 110, a lock on shared object BB is not needed to determine the correct result.

Figure 6:
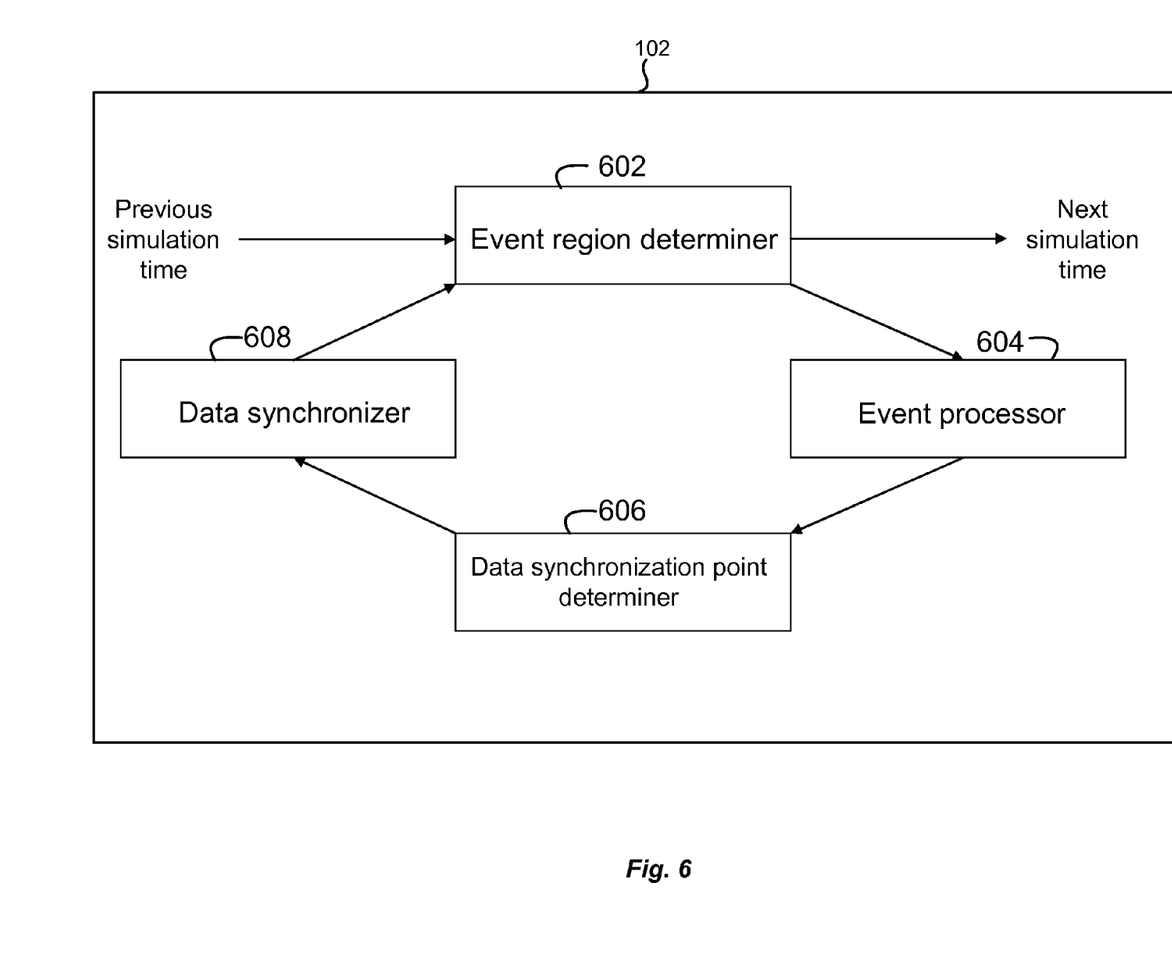
FIG. 6 depicts an example of simulator according to one embodiment.

FIG. 6 depicts an example of simulator 102 according to one embodiment. As shown, an event region determiner 602 is configured to determine an event region 110 in which to process events. Event region determiner 602 may determine the event region based on an ordered priority of event regions.

Event processor 604 is configured to process events for an event queue 106 found in the determined event region 110. The events are processed in any order. As mentioned above, if kernel 104 does not have events in the determined event region 110, kernel 104 waits for other kernels 104 to process events before moving on to another event region 110.

A data synchronization point determiner 606 determines when data synchronization should occur. This may occur at the end of processing an event queue 106.

A data synchronizer 608 synchronizes data among kernels 104. Once data is synchronized, event region determiner 602 may determine another event region 110 to process. Also, event region determiner 602 may determine that the simulation time should be moved forward or should end.

Accordingly, a parallel simulator is provided that can simulate a design under test without using a memory lock for shared objects. This is provided because kernels 104 operate in event regions 110 according to a priority. Kernels 104 process events in an event queue for the same event region 110. Data synchronization may occur at the end of the processing of an event queue. Because kernels 104 all process events in the same event region 110, data correctness may be adhered to, and a memory lock may not be needed. This improves speed of simulation while ensuring the correct results because kernels 104 do not have to wait to process events due to shared objects being locked.

Although the description has been described with respect to particular embodiments thereof, these particular embodiments are merely illustrative, and not restrictive.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method for simulating a circuit design, the method comprising:
   receiving a partition of a plurality of partitions of the circuit design at a kernel in a plurality of kernels that simulate partitions of the circuit design in parallel, the kernels being configured to perform parallel simulation of the circuit design on one or more computing systems;
   determining a plurality of events in a delta cycle of the parallel simulation to simulate based on the partition, the plurality of events classified in a plurality of event regions that have an ordered priority assigned;
   determining a first event region of the plurality of event regions to process events based on priorities assigned to the event regions;
   processing one or more events in the first event region using the kernel and an object shared with at least one other kernel of the plurality of kernels, wherein the plurality of kernels process the events in the first event region;
   with a data synchronization point determiner, determining one or more data synchronization points at the end of one or more but not all of the plurality of event regions; and
   synchronizing data with the at least one other kernel of the plurality of kernels at one or more of the data synchronization points, wherein:
     the kernel waits until all of the plurality of kernels reach respective data synchronization points for the first event region before processing events in another event region,
     the synchronizing comprises synchronizing state changes to the shared object, and
     data is not synchronized with other kernels of the plurality of kernels at event regions without the determined one or more data synchronization points.

2. The method of claim 1, further comprising:
   determining a second event region to process events based on the ordered priority assigned to the event regions;
   processing one or more events in the second event region using the kernel and the object shared with at least one other kernel of the plurality of kernels, wherein the plurality of kernels process the events in the second event region; and
   synchronizing data with the at least one other kernel of the plurality of kernels at one of the one or more data synchronization points, wherein the kernel waits until all of the plurality of kernels reach respective data synchronization points for the second event region before processing events in another event region.

3. The method of claim 1, wherein determining the first event region comprises determining the event region that includes events to be executed and is assigned the highest priority.

4. The method of claim 1, further comprising:
   generating a new event for a second event region in the plurality of event regions, the second event region being of a higher priority than the first event region;
   moving to the second event region to process events; and
   processing the new event using the kernel and an object shared with at least one other kernel of the plurality of kernels, wherein all kernels in the plurality of kernels process events in the second event region.

5. The method of claim 1, wherein the synchronization point is an end of an event queue that is storing events for the first event region, and wherein the kernel synchronizes data with the at least one other kernel upon reaching the end of the event queue.

6. The method of claim 1, wherein a memory lock is not used to lock access to the shared object.

7. The method of claim 1, wherein the synchronization point is user-defined.

8. The method of claim 1, wherein the priorities are assigned to the event regions based on an execution model of a design language used to model the circuit design.

9. The method of claim 1, wherein the one or more events are stored in an event queue that is associated with the first event region, wherein each event region is associated with an event queue.

10. The method of claim 1, further comprising:
determining a second event region to process events based on the ordered priority assigned to event regions, wherein the second event region has a lower assigned priority than the first event region;
after processing the events in the first event region, processing one or more events in the second event region using the kernel and the object shared with at least one other kernel of the plurality of kernels, wherein the plurality of kernels process the events in the same second event region; and
synchronizing data with the least one other kernel of the plurality of kernels at one or more of the user-defined data synchronization points, wherein the kernel waits until all of the plurality of kernels reach respective data synchronization point for the second event region before processing events in another event region.

11. The method of claim 10, further comprising:
after commencing the processing the events in the second region, generating a new event for the first event region; and
processing the new event using the kernel and an object shared with at least one other kernel of the plurality of kernels, wherein all kernels in the plurality of kernels process events in the first event region.

12. The method of claim 1, wherein the one or more of the data synchronization points is selected from a group consisting of at least one or more of the following: end of a current active event queue, end of a non-active event queue, end of a non-blocking active (NBA) event queue, or end of a re-active event queue.

13. One or more computer-readable storage media or memory not including propagation media storing computer-readable instructions that when executed by a computer, cause the computer to perform a method, the method comprising:
receiving a partition of a plurality of partitions of a circuit design at a kernel in a plurality of kernels that simulate partitions of the circuit design in parallel;
populating a plurality of event queues with events to simulate based on the partition, the plurality of event queues being in a plurality of event regions that have an ordered priority assigned, one or more of the event regions being specified as user-defined data synchronization points;
determining a first event region of the plurality of event regions in a delta cycle to process events from an event queue based on priorities assigned to event regions in the plurality of event regions;
processing one or more events in the event queue in the first event region using the kernel and an object shared with at least one other kernel of the plurality of kernels, wherein the plurality of kernels process the events in event queues in the same event region;
after the processing the events in the first event region, generating a new event for a second event region in the plurality of event regions, the second event region in the delta cycle being of a higher priority than the first event region;
moving the kernel to the second event region to process events;
processing the new event using the kernel, wherein all kernels in the plurality of kernels process events in the second event region; and
after the processing the new event, synchronizing data with the least one other kernel of the plurality of kernels at one of the user-defined data synchronization points, the synchronizing comprising synchronizing state changes to a shared object to other kernels in the plurality of kernels.

14. The computer-readable storage media or memory of claim 13, wherein the method further comprises:
determining a second event region to process events based on the ordered priority assigned to event regions;
processing one or more events in the second event region using the kernel and the object shared with at least one other kernel of the plurality of kernels, wherein the plurality of kernels process the events in the same second event region; and
synchronizing data with the least one other kernel of the plurality of kernels at another one of the user-defined data synchronization points, wherein the kernel waits until all of the plurality of kernels reach a data synchronization point for the second event region before processing events in another event region.

15. The computer-readable storage media or memory of claim 13, wherein the determining the first event region further comprises determining the event region that includes events to be executed and is assigned the highest priority.

16. The computer-readable storage media or memory of claim 13, wherein the synchronization point is an end of an event queue that is storing events for the first event region, wherein the kernel synchronizes data with the at least one other kernel upon reaching the end of the event queue.

17. The computer-readable storage media or memory of claim 13, wherein a memory lock is not used to lock access to the shared object.

18. The computer-readable storage media or memory of claim 13, wherein the priorities are assigned to the event regions based on an execution model of a design language used to model the circuit design.

19. The computer-readable storage media or memory of claim 13, wherein the one or more events are stored in an event queue that is associated with the first event region, wherein each event region is associated with an event queue.

20. The method of claim 13, wherein the synchronizing data uses user-defined data synchronization points in combination with or in lieu of data synchronization points based on an execution model of the parallel simulation.

21. Computing hardware configured to execute a plurality of kernels, the kernels being configured to perform parallel simulation of a circuit design on the computing hardware, each kernel being configured to:
receive a partition of a plurality of partitions of a circuit design at a kernel in a plurality of kernels that simulate partitions of the circuit design in parallel;

populate a plurality of event queues in a delta cycle with events to simulate based on the partition, each of the plurality of event queues being associated with one of a plurality of event regions that have an ordered priority assigned, the event regions comprising at least one or more of the following: preponed, preactive, active, inactive, pre-NBA, NBA, post-NBA, observer, post-observed, reactive, re-inactive, pre-postponed, or postponed;

determine an event region of the plurality of event regions to process events from at least one event queue associated with the event region based on priorities assigned to one or more event regions in the plurality of event regions;

process one or more events in the at least one event queue associated with the determined event region using the kernel and an object shared with at least one other kernel of the plurality of kernels, wherein the plurality of kernels process events in respective event queues associated with the same selected event region; and when the processing of the events in the at least one event queue is determined to be finished, synchronize data with the least one other kernel of the plurality of kernels at a data synchronization point before the end of the delta cycle, the synchronizing comprising synchronizing state changes to a shared object to other kernels in the plurality of kernels; wherein the synchronizing is only performed at the end of one or more of the following event regions: active, inactive, NBA, reactive, and post-poned.

* * * * *